United States Patent
Okinaka et al.

(10) Patent No.: US 7,355,339 B2
(45) Date of Patent: Apr. 8, 2008

(54) ORGANIC ELECTROLUMINESCENT DISPLAY AND APPARATUS INCLUDING ORGANIC ELECTROLUMINESCENT DISPLAY

(75) Inventors: Keiji Okinaka, Kanagawa (JP); Hikaru Hoshi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 227 days.

(21) Appl. No.: 10/656,126

(22) Filed: Sep. 8, 2003

(65) Prior Publication Data

US 2004/0051447 A1 Mar. 18, 2004

(30) Foreign Application Priority Data

Sep. 12, 2002 (JP) ............................. 2002-267043

(51) Int. Cl.
*H01L 51/00* (2006.01)
(52) U.S. Cl. .................. 313/504; 313/506; 257/98
(58) Field of Classification Search ............... 313/503, 313/504, 506, 501, 110, 111; 428/917; 257/98
See application file for complete search history.

(56) References Cited

U.S. PATENT DOCUMENTS

| | | | |
|---|---|---|---|
| 4,539,507 A | 9/1985 | VanSlyke et al. | 313/504 |
| 4,720,432 A | 1/1988 | VanSlyke et al. | 428/457 |
| 4,885,211 A | 12/1989 | Tang et al. | 428/457 |
| 5,130,603 A | 7/1992 | Tokailin et al. | 313/504 |
| 5,151,629 A | 9/1992 | VanSlyke | 313/504 |
| 5,227,252 A | 7/1993 | Murayama et al. | 428/690 |
| 5,247,190 A | 9/1993 | Friend et al. | 257/40 |
| 5,317,169 A | 5/1994 | Nakano et al. | 257/40 |
| 5,382,477 A | 1/1995 | Saito et al. | 428/690 |

(Continued)

FOREIGN PATENT DOCUMENTS

JP 2-247278 10/1990

(Continued)

OTHER PUBLICATIONS

M. Born et al., Principals of Optics: Electromagnetic Theory of Propagation Interference and Diffraction of Light, 6th ed., Cambridge University Press, United Kingdom, pp. 169-170, 213 (1980).
J.H. Burroghes, et al., "Light-Emitting Diodes Based on Conjugated Polymers", Nature, vol. 347, pp. 539-541 (1990).
C.W. Tang, et al., "Organic Electroluminescent Diodes", Appl. Phys. Lett., vol. 51, No. 12, pp. 913-915 (1987).

(Continued)

*Primary Examiner*—Karabi Guharay
*Assistant Examiner*—Anthony Canning
(74) *Attorney, Agent, or Firm*—Fitzpatrick, Cella, Harper & Scinto

(57) ABSTRACT

An organic electroluminescent display includes an organic electroluminescent device, having a microcavity structure, for emitting light resonating in the microcavity structure; a light-shielding layer having an opening through which a portion of the light emitted from the organic electroluminescent device passes; and a light-gathering structure, disposed between the organic electroluminescent device and the light-shielding layer, for gathering the light emitted from the organic electroluminescent device. An apparatus includes a controller for providing image information; an organic electroluminescent device, having a microcavity structure, for emitting light resonating in the microcavity structure, based on the image information provided from the controller; a light-shielding layer having an opening through which a portion of the light emitted from the organic electroluminescent device passes; and a light-gathering structure, disposed between the organic electroluminescent device and the light-shielding layer, for gathering the light emitted from the organic electroluminescent device.

10 Claims, 7 Drawing Sheets

U.S. PATENT DOCUMENTS

| | | | |
|---|---|---|---|
| 5,409,783 A | 4/1995 | Tang et al. | 428/690 |
| 5,514,878 A | 5/1996 | Holmes et al. | 257/40 |
| 5,554,911 A | 9/1996 | Nakayama et al. | 313/504 |
| 5,672,678 A | 9/1997 | Holmes et al. | 528/373 |
| 5,855,994 A * | 1/1999 | Biebuyck et al. | 428/209 |
| 5,994,835 A * | 11/1999 | Wilson et al. | 313/504 |
| 6,093,864 A | 7/2000 | Tokailin et al. | 585/25 |
| 6,125,226 A * | 9/2000 | Forrest et al. | 385/131 |
| 6,339,289 B1 * | 1/2002 | Fork | 313/506 |
| 6,406,801 B1 | 6/2002 | Tokito et al. | 428/690 |
| 2001/0036561 A1 * | 11/2001 | Wolk et al. | 428/690 |
| 2002/0061418 A1 * | 5/2002 | Imanishi | 428/690 |
| 2003/0011303 A1 * | 1/2003 | Matthies et al. | 313/506 |

FOREIGN PATENT DOCUMENTS

| | | |
|---|---|---|
| JP | 3-255190 | 11/1991 |
| JP | 4-145192 | 5/1992 |
| JP | 5-202356 | 8/1993 |
| JP | 5-24760 | 9/1993 |
| JP | 6-275381 | 9/1994 |
| JP | 9-202878 | 8/1997 |
| JP | 9-227576 | 9/1997 |
| JP | 11-288786 | 10/1999 |

* cited by examiner

PIXEL PITCH

ORGANIC ELECTROLUMINESCENT DISPLAY AND APPARATUS INCLUDING ORGANIC ELECTROLUMINESCENT DISPLAY

BACKGROUND OF THE INVENTION

1. Field of the Invention

The present invention relates to displays including organic electroluminescent devices (herein referred to as organic EL devices) and particularly relates to an organic electroluminescent display (herein referred to as an organic EL display) having high quality display.

2. Description of the Related Art

An organic EL device is a device that includes an anode, a cathode, and a layer disposed therebetween which contains a fluorescent organic compound and which emits light according to the following mechanism: holes and electrons are injected from the anode and the cathode, respectively, into the layer such that excitons of the fluorescent organic compound are formed, whereby luminescence is achieved when the excitons returns to the ground state.

According to a study by Eastman Kodak Co. (Appl. Phys. Lett., vol. 51, pp. 913-915 (1987)), it has been reported that a function-separation type organic luminescent device has a luminance of about 1,000 cd/m$^2$ under the application of a voltage of 10 volts; such a device includes an anode containing ITO, a cathode containing a magnesium-silver alloy, a first layer containing tris(8-quinolinolato) aluminum having an electron-transporting function and a luminescent function, and a second layer containing a triphenylamine derivative having a hole-transporting function. Examples of related U.S. patents include U.S. Pat. Nos. 4,539,507, 4,720,432, and 4,885,211.

Furthermore, by changing species of the fluorescent organic compound, it is possible to effect luminescence in a broad wavelength region ranging from the ultraviolet region to the infrared region. In this regard, various compounds have been extensively studied in recent years. Such compounds are disclosed in, e.g., U.S. Pat. Nos. 5,151,629, 5,409,783, and 5,382,477, and Japanese Unexamined Patent Application Publication Nos. 2-247278 (corresponding to U.S. Pat. Nos. 5,130,603 and 6,093,864), 3-255190 (corresponding to U.S. Pat. No. 5,227,252), 5-202356, 9-202878, and 9-227576.

In addition to the above-mentioned organic EL device, another organic EL device using a conjugated polymer has been reported by a research group at Cambridge University (Nature, vol. 347, pp. 539-541 (1990)). According to this report, a layer containing polyphenylenevinylene (PPV) is formed with a coating apparatus, and luminescence is achieved by the use of such a single layer. Such an organic luminescence device using a conjugated polymer is disclosed in, e.g., U.S. Pat. Nos. 5,247,190, 5,514,878, and 5,672,678, and Japanese Unexamined Patent Application Publication Nos. 4-145192 (corresponding to U.S. Pat. No. 5,317,169) and 5-247460.

As described above, recent progress with respect to organic EL devices is noticeable; that is, organic EL devices have high luminescence and high speed responsiveness under the application of a small voltage and also have a small thickness and weight, thereby allowing such devices to be used in various applications. In particular, the use of the devices in display applications has become a focus of attention.

FIG. 5 is a sectional view showing a conventional organic EL device. This device includes a first electrode 1 that is transparent, a second electrode 2 that is reflective, and an organic compound layer 3 disposed therebetween. In the device, light emitted from the organic compound layer 3 is transmitted through a light-transmitting surface disposed on the side close to the first electrode 1. Since external light 4 entering the light-transmitting surface is reflected by the second electrode 2 and then transmitted through the light-transmitting surface, the external light 4 is mixed with the light emitted from the organic compound layer 3. Therefore, in organic EL displays including such organic EL devices arranged in a two-dimensional manner, there is a problem in that the contrast is low, and thus the display quality is poor.

Furthermore, in the luminescence of organic EL devices, the monochromaticity and color purity are insufficient for some uses. In order to solve this problem, an organic EL device having a microresonator structure (microcavity structure) has been proposed. Such a device is disclosed in, for example, Japanese Unexamined Patent Application Publication Nos. 6-275381 (corresponding to U.S. Pat. No. 5,554,911) and 11-288786 (corresponding to U.S. Pat. No. 6,406,801). According to this configuration, in the luminescence of the device, the directivity is high in the direction facing the front face of the device, and the monochromaticity is high depending on the resonant frequency of a microresonator.

FIG. 6 is a sectional view showing a conventional organic EL device having microresonator structures. This device includes a first electrode 5 that is transparent, a second electrode 6 that is reflective, an organic compound layer 7 disposed therebetween, and a multi-layer dielectric mirror layer 8 disposed on the first electrode 5.

Light emitted from the organic compound layer 7 resonates in a resonator formed by the multi-layer dielectric mirror layer 8 and the second electrode 6, whereby a first ray 9a having the following features is emitted: directivity that is high in the direction facing the front face of the device and high monochromaticity, that is, a particular wavelength band. However, in a second ray 9b emitted in a direction diagonal to the organic EL device, the frequency is shifted.

FIG. 7 is a graph showing the relationship between the observation angle (that is, an emission angle) and the peak of luminescence wavelength. As shown in FIG. 7, an increase in observation angle shifts the wavelength of observed light to a short wavelength region. In an organic EL display including the organic EL devices arranged in a two-dimensional manner, each having the microresonator structure, although the color purity of emitted light is excellent, the color of the emitted light observed in a direction diagonal to the organic EL devices is different from that of the emitted light observed in the direction facing the devices. Therefore, there is a problem in that the color purity is deteriorated depending on the observation position, that is, the display quality is deteriorated.

SUMMARY OF THE INVENTION

It is an object of the present invention to provide an organic EL display having high quality display achieved by increasing the color purity of emitted light observed by an observer. It is another object of the present invention to provide an organic EL display having high contrast achieved by reducing the reverse effect of external light.

According to a first aspect of the present invention, an organic EL display includes an organic EL device, having a microcavity structure, for emitting light resonating in the microcavity structure; a light-shielding layer having an opening through which a portion of the light emitted from the organic EL device passes; and a light-gathering structure, disposed between the organic EL device and the light-shielding layer, for gathering the light emitted from the organic EL device.

In the display, it is preferable that the light-gathering structure includes a lens, that the opening or the light-shielding layer is disposed in the vicinity of the focus of the lens, and that the light-shielding layer includes a light-absorbing member for preventing external light transmitted from the outside from being reflected.

According to a second aspect of the present invention, an organic EL display includes an organic EL device array including a plurality of organic EL devices, each having a microcavity structure, for emitting light resonating in the microcavity structure; a light-gathering layer including light-gathering structures, arranged so as to correspond to the organic EL devices, for gathering the light emitted from the organic EL devices; and a light-shielding layer having openings through which a portion of the light emitted from the organic EL devices passes, wherein the organic EL devices are arranged in a plane and the openings are arranged so as to correspond to the light-gathering structures.

In the above display, the light-gathering layer preferably includes first and second transparent members having different refractive indexes with spherical faces disposed therebetween. Alternatively, the light-gathering layer preferably includes a transparent member having convex faces bulging toward the organic EL devices and a cavity portion disposed between the organic EL devices and the transparent member. The light-gathering structures of the light-gathering layer are preferably arranged at a pitch smaller than or equal to a pitch at which the organic EL devices of the organic EL device array are arranged.

Furthermore, the openings are preferably each arranged in the vicinity of the focus of each light-gathering structure. The openings are preferably arranged such that light emitted in the direction perpendicular to a plane on which the organic EL devices are arranged passes through each opening. The openings preferably have a size determined based on the wavelength of the light emitted from the organic EL devices. The openings have a circular shape, a rectangular shape, or an elliptic shape. Alternatively, the openings preferably have a circular shape and a radius that is 0.7 to 3.0 times larger than that of a circle of least confusion.

The light-shielding layer preferably includes a light-absorbing member for preventing external light transmitted from the outside from being reflected.

According to a third aspect of the present invention, an apparatus includes a controller for providing image information; an organic EL device, having a microcavity structure, for emitting light resonating in the microcavity structure, based on the image information provided from the controller; a light-shielding layer having an opening through which a portion of the light emitted from the organic EL device passes; and a light-gathering structure, disposed between the organic EL device and the light-shielding layer, for gathering the light emitted from the organic EL device.

According to a fourth aspect of the present invention, an apparatus includes a controller for providing image information; an organic EL device array including a plurality of organic EL devices, each having a microcavity structure, for emitting light resonating in the microcavity structure, based on the image information provided from the controller; a light-gathering layer including light-gathering structures, arranged so as to correspond to the organic EL devices, for gathering the light emitted from the organic EL devices; and a light-shielding layer having openings through which a portion of the light emitted from the organic EL devices passes, wherein the organic EL devices are arranged on a plane and the openings are arranged so as to correspond to the light-gathering structures.

Further objects, features and advantages of the present invention will become apparent from the following description of the preferred embodiments with reference to the attached drawings.

DESCRIPTION OF THE PREFERRED EMBODIMENTS

Embodiments of the present invention will now be described in detail with reference to the attached drawings.

First Embodiment

Figure 1:
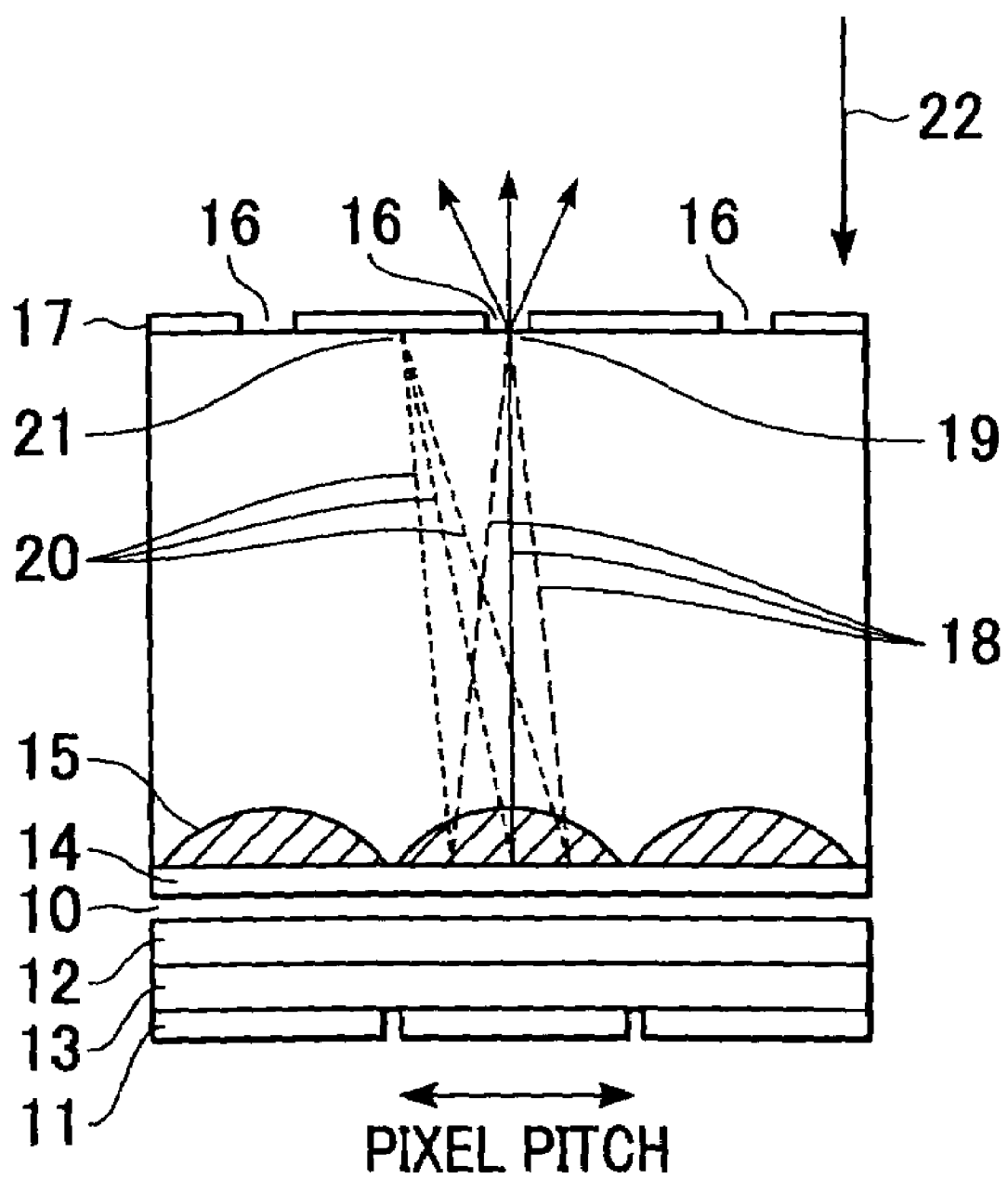
FIG. 1 is a schematic sectional view showing an organic EL display according to a first embodiment of the present invention.

FIG. 1 is a schematic sectional view showing an organic EL display according to a first embodiment of the present invention.

This display includes reflective cathodes 11, an electron-transport layer 13 containing an organic compound, a hole-transport layer 12 containing another organic compound, a transparent anode 10, and a multi-layer dielectric mirror layer 14 arranged in that order. The multi-layer dielectric mirror layer 14 and the reflective cathodes 11 form optical resonator structures (microcavity structures). The display further includes light-gathering structures 15, disposed on the multi-layer dielectric mirror layer 14, and a light-shielding layer 17, disposed above the light-gathering structures 15, having openings 16.

A first ray 18, emitted from each optical resonator structure, having high directivity in the front direction is caused to converge in the vicinity of a first converging point 19 with each light-gathering structure 15 and then transmitted through each opening 16 toward the outside. In contrast, a second ray 20 emitted from the optical resonator structure in a diagonal direction (that is, the wavelength is shifted to a shorter wavelength region as compared with rays emitted in the front direction) is caused to converge at a second converging point 21 with the light-gathering structure 15. Thus, rays having short wavelengths can be spatially isolated. That is, the second ray 20 emitted in a diagonal direction is blocked with the light-shielding layer 17 and therefore is not transmitted toward the outside of the display.

Furthermore, when the light-shielding layer 17 comprises a light-absorbing material, external light 22 that is incident on regions other than the openings 16 can be prevented from being reflected. Thus, the contrast can be enhanced by reducing the area of the openings 16.

In the above configuration, the light-gathering structures 15 are preferably arranged at a pitch less than or equal to the pixel pitch.

According to the above configuration, the contrast can be enhanced and the color purity of observed light can also be enhanced (that is, light having high monochromaticity can be achieved).

The configuration described above is general. Therefore, the electrodes (the transparent anode 10 and the reflective cathodes 11), the organic compound layers (the hole-transport layer 12 and the electron-transport layer 13), and the multi-layer dielectric mirror layer 14 are not limited to the above types.

The following configurations may be used: a configuration having three organic compound layers consisting of an electron-transport layer, a light-emitting layer, and a hole-transport layer having different functions and another configuration in which a hole injection layer for improving the efficiency of hole injection is disposed between an anode and a hole-transport layer. Light need not be transmitted from the anode side but may be transmitted from the cathode side.

Organic compounds each contained in the corresponding organic compound layers include known hole-transport compounds, electron-transport and light-emitting compounds, light-emitting compounds, light-emitting matrix compounds, electron-transport compounds, hole-transport polymers, light-emitting polymers, and electron-transport polymers. These compounds and polymers may be used alone or in combination. However, the organic compounds are not limited to the above types.

An anode material preferably has a large work function and includes, for example, a single metal such as gold, platinum, nickel, palladium, cobalt, selenium, and vanadium; alloy thereof; and metal oxides such as tin oxide, zinc oxide, indium tin oxide (ITO), and indium zinc oxide. These materials may be used alone or in combination.

In contrast, a cathode material preferably has a small work function and includes a single metal such as lithium, sodium, potassium, calcium, magnesium, aluminum, indium, silver, lead, tin, and chromium; alloys thereof; and metal oxides such as indium tin oxide (ITO). The cathodes 11 may have a single layer structure or a multi-layer structure.

The light-gathering structures 15 include known microlenses, which are of a converging lens type. Such microlenses are used as a microlens array included in, for example, panels for liquid crystal projectors. Such a microlens array includes, for example, a graded refractive index microlens array prepared by processing a glass substrate by an ion exchange process; a convex lens array prepared by a 2P process (photopolymerization process) using a photocurable resin; and a structure in which another convex lens array, a resin having low refractive index, and a glass cover for sealing the resin are arranged in that order.

Figure 7:
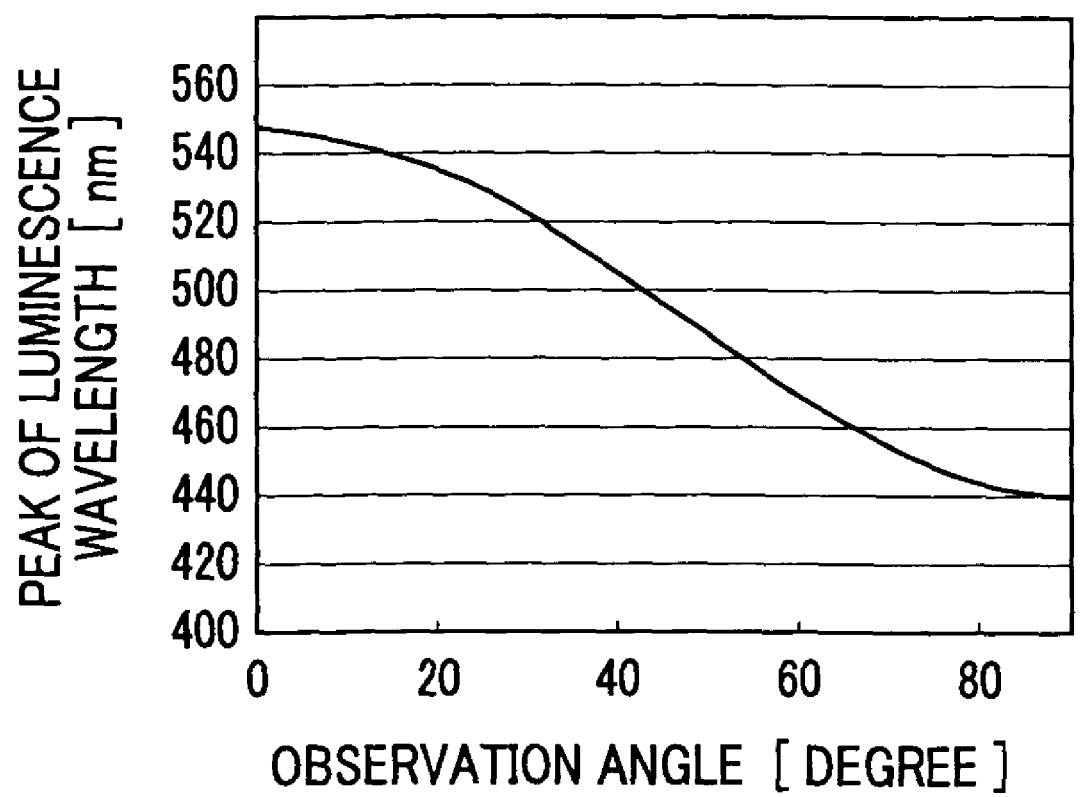
FIG. 7 is a graph showing the relationship between the observation angle and the peak of luminescence wavelength according to a conventional organic EL device having a microresonator structure.

The focal length of the microlenses and the opening diameter of the light-shielding layer 17 are each set to corresponding optimum values depending on the color purity of light passing through the openings 16 (that is, the percentage of light having undesired wavelengths in the passing light) and the luminous energy of the passing light. Since the convergence of light gathered with the microlenses depends on not only the F-number and optical aberration of the microlenses but also the light wavelength, the opening diameter may be varied depending on the wavelength of red, green, and blue colors. For example, when spherical aberration due to the microlenses is negative (that is, the optical axis of system and an incident ray that is substantially parallel to the optical axis are caused to cross at a position before the paraxial focus), each opening 16 is preferably disposed at a region (circle of least confusion) in which a pencil of rays has the largest average energy density, the region being located before the focus of each microlens. Thereby, the color purity is enhanced, and the luminous energy of passing light is increased. The opening diameter is preferably 0.7 to 3 times larger than that of the circle of least confusion depending on the color purity and the luminous energy, and more preferably 1 to 2 times. The diameter may be determined based on the relationship between the observation angle and the peak of luminescence wavelength, as shown in FIG. 7, when the aberration due to the microlenses is small.

The multi-layer dielectric mirror layer 14 has a configuration in which two types of dielectric sub-layers having different refractive indexes are mutually arranged. For example, a configuration in which $SiO_2$ sub-layers and $TiO_2$ sub-layers are mutually arranged may be used. The reflectivity can be adjusted by varying the number of sub-layers and the thickness.

The light-shielding layer 17 and the openings 16 disposed in the light-shielding layer 17 can be prepared by a known method for preparing a black matrix for color filters. The light-shielding layer 17 preferably contains such a material that prevents light from entering the reflective cathodes 11 for organic EL devices. Such a material includes various paints, metal oxides, and dielectric materials. When such organic EL devices are used for direct-view displays, a light-absorbing material such as a black resin is preferably used because the display contrast is enhanced.

The shape of the openings 16 is not limited to a circle but may be a rectangle or an ellipse depending on the use.

The combination of the above organic EL display and an apparatus, such as a personal computer, a PDA terminal, a video camera, a digital camera, or a projector, for generating and supplying image information to be displayed provides a display-equipped electronic device that can be used under the application of external light.

Second Embodiment

Figure 2:
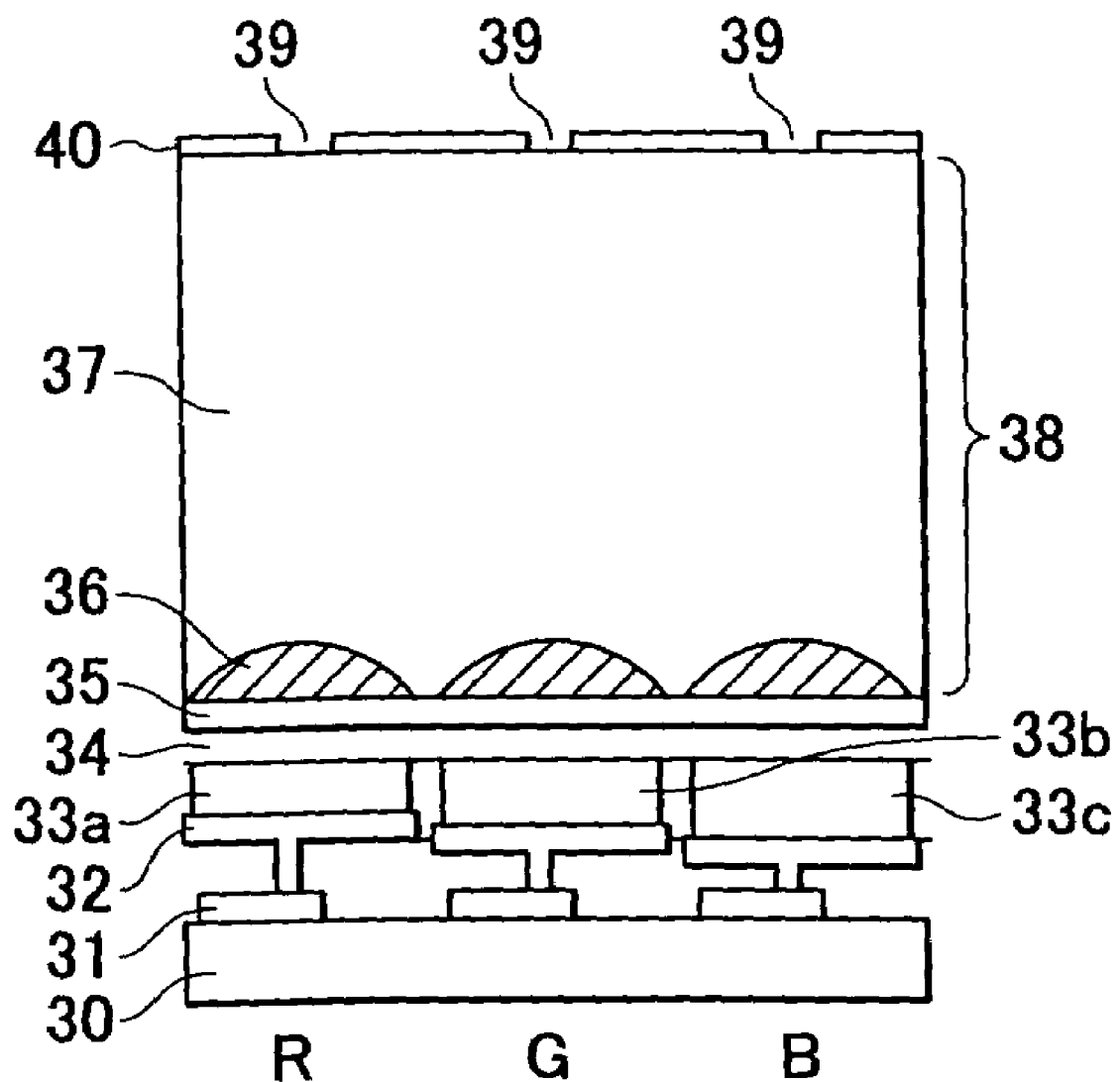
FIG. 2 is a schematic sectional view showing a full-color organic EL display according to a second embodiment of the present invention.
Figure 3:
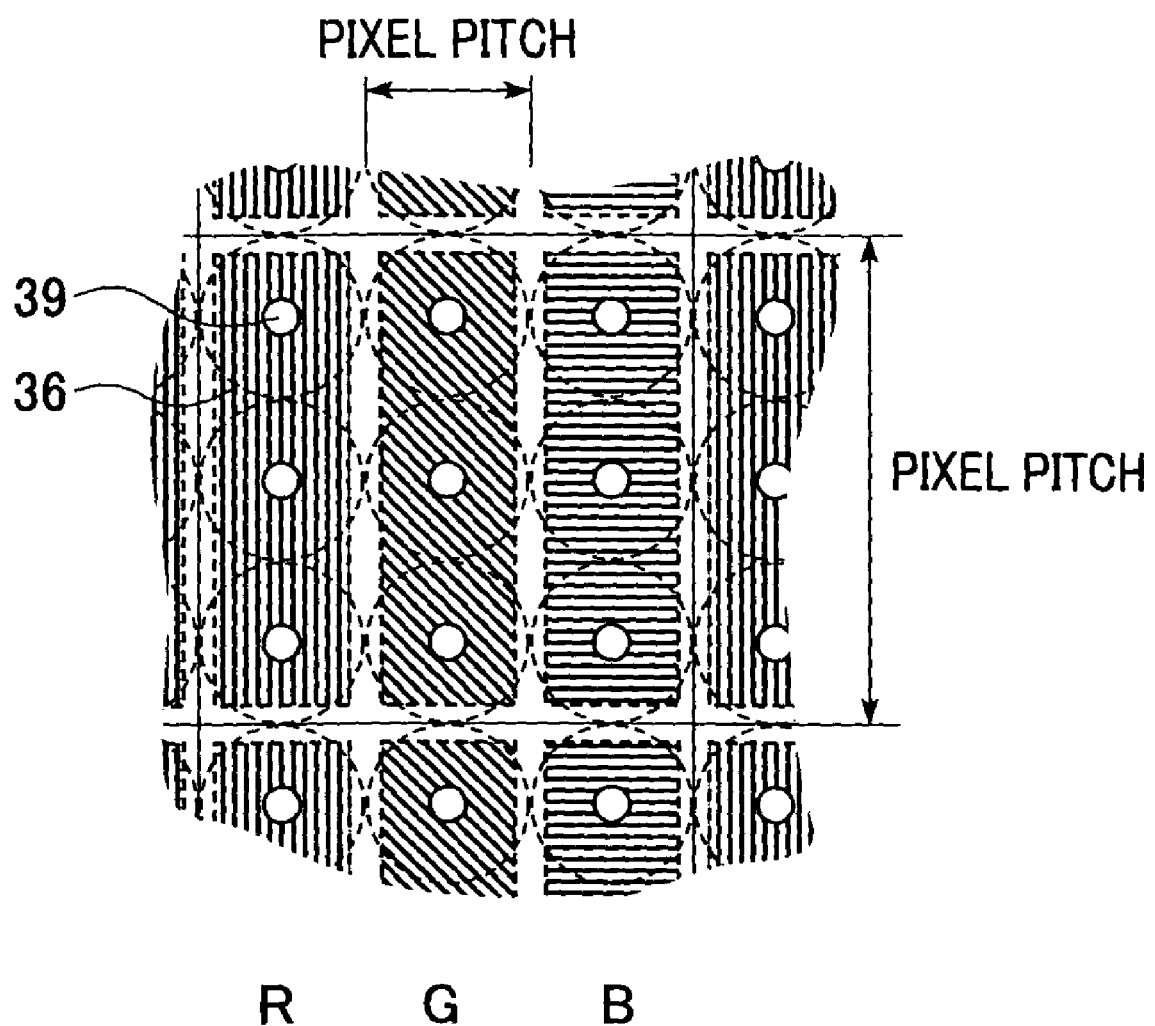
FIG. 3 is a schematic top plan view showing such a display.

FIG. 2 is a schematic sectional view showing a full-color organic EL display according to a second embodiment of the present invention. FIG. 3 is a schematic top plan view showing such a display.

A substrate 30, TFTs 31 for each driving corresponding pixels, and reflective electrodes 32 are arranged in that order. The reflective electrodes 32 contain Mg—Ag alloy and have a rectangular shape when viewed from above. The reflective electrodes 32 formed by a vacuum deposition process are periodically arranged. First, second, and third organic compound layers 33a, 33b, and 33c, formed by a vacuum deposition process, for emitting red light (R), green light (G), and blue light (B), respectively, are disposed on the reflective electrodes 32. In this configuration, the longitudinal pixel pitch is 180 μm, and the lateral pixel pitch is 60 μm.

A transparent electrode 34, formed by a sputtering process, containing indium tin oxide (ITO) is disposed on the first, second, and third organic compound layers 33a, 33b, and 33c. A multi-layer dielectric mirror 35 is disposed on the transparent electrode 34 and has a configuration in which eight layers are arranged; that is, four SiO$_2$ layers and four TiO$_2$ layers formed by a sputtering process are mutually arranged.

The reflective electrodes 32 and the multi-layer dielectric mirror 35 form optical resonator structures (microcavity structures). The thickness of the first, second, and third organic compound layers 33a, 33b, and 33c is adjusted such that different optimum resonator lengths can be obtained depending on red light, green light, and blue light.

An embedded microlens array layer 38 is disposed on the multi-layer dielectric mirror 35. The microlens array layer 38 includes a first transparent member 36 containing a plastic material; a second transparent member 37, disposed on the first transparent member 36, containing another plastic material; and a plurality of spherical microlenses disposed between the first and second transparent members 36 and 37. The first transparent member 36 has a refractive index n1 of 1.61, and the second transparent member 37 has a refractive index n2 of 1.40. The microlenses have a radius of curvature of 43 μm, a lens diameter of 60 μm, a focal length of about 285 μm, and an F-number of 4.75 and also have a plano-convex shape. Light, emitted from each optical resonator structure and then gathered by each microlens, is brought to a focus located at a position that is about 285 μm from the top of the microlens. The microlenses are periodically arranged in a matrix at a pitch of 60 μm, and a triplet of the microlenses is arranged for each pixel corresponding to red light (R), green light (G), or blue light (B), as shown in FIG. 3. The microlens array layer 38 has a thickness of 230 μm.

A light-shielding layer 40 containing a black resin is disposed on the embedded microlens array layer 38. The light-shielding layer 40 has circular openings 39 having a radius of 7 μm, and the center of each circular opening 39 is aligned with the optical axis (focus) of each microlens.

According to the above configuration, the color purity is enhanced, and the reflection due to external light is suppressed, thereby achieving high quality display.

Third Embodiment

Figure 4:
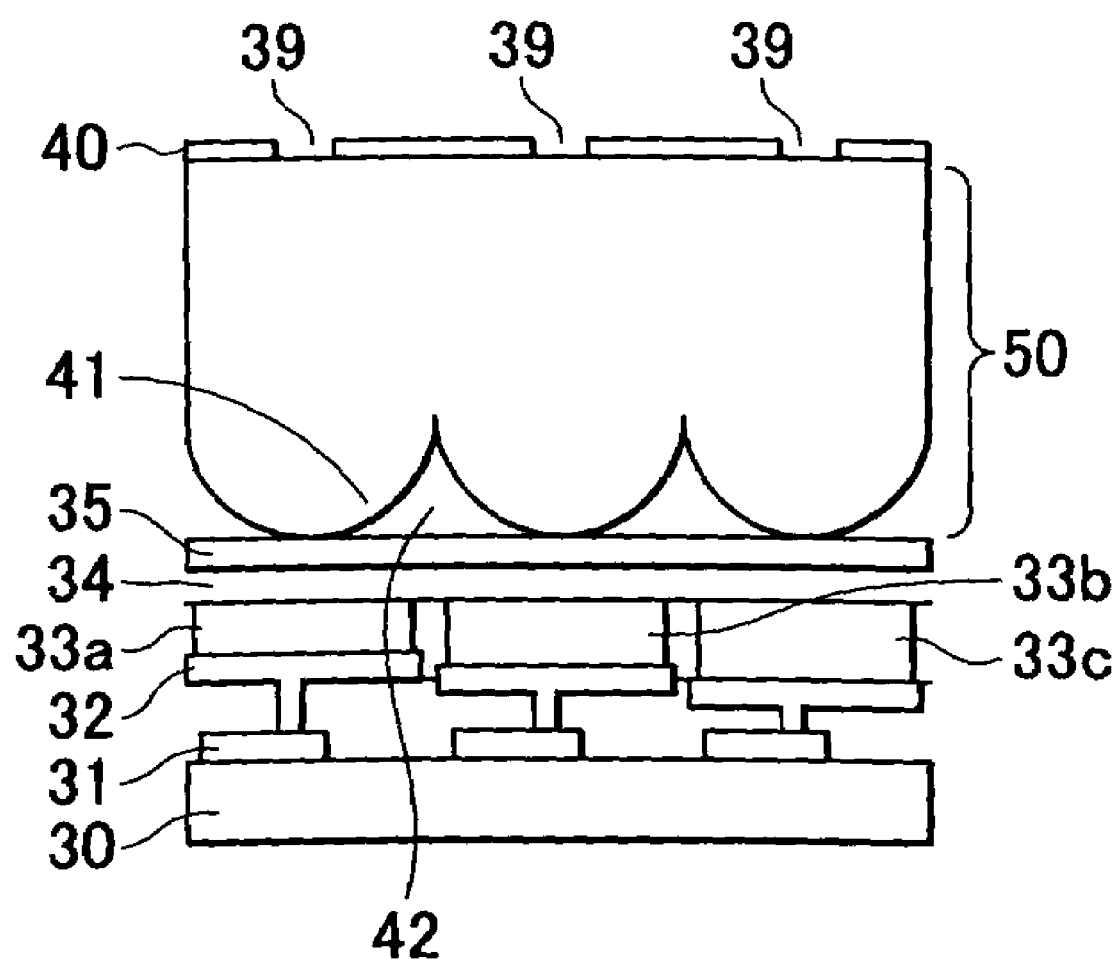
FIG. 4 is a schematic sectional view showing a full-color organic EL display according to a third embodiment of the present invention.
Figure 5:
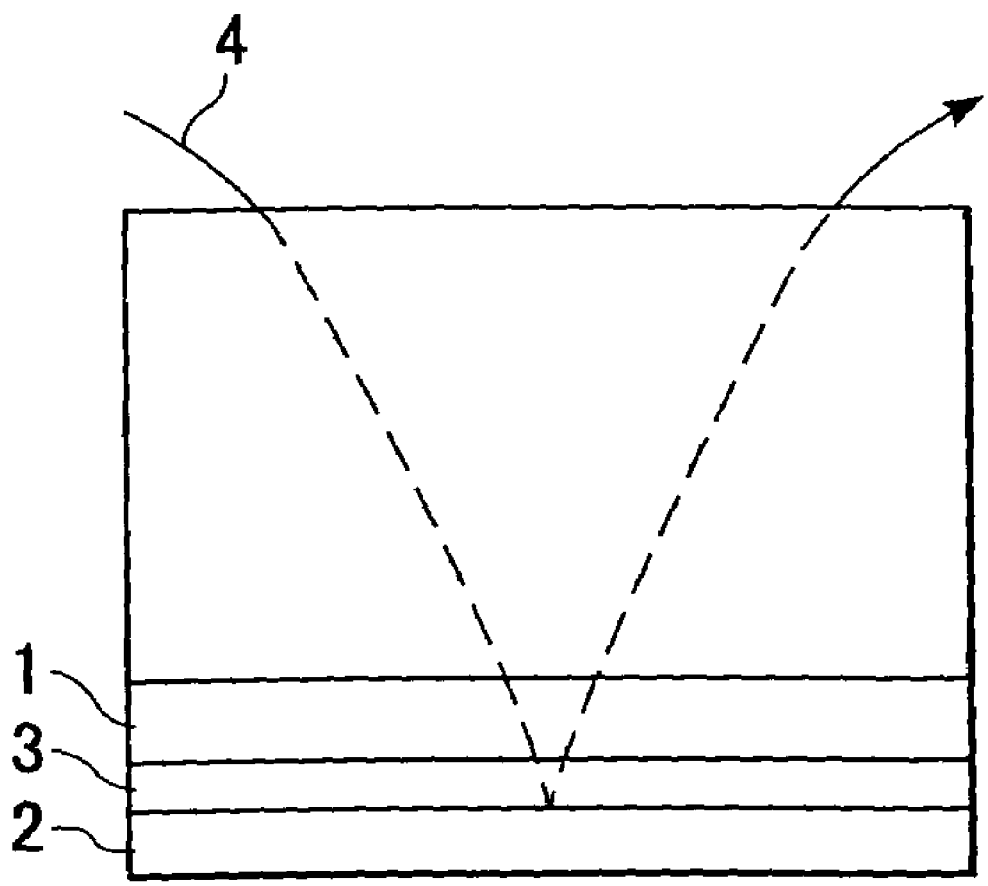
FIG. 5 is a sectional view showing a conventional organic EL device.
Figure 6:
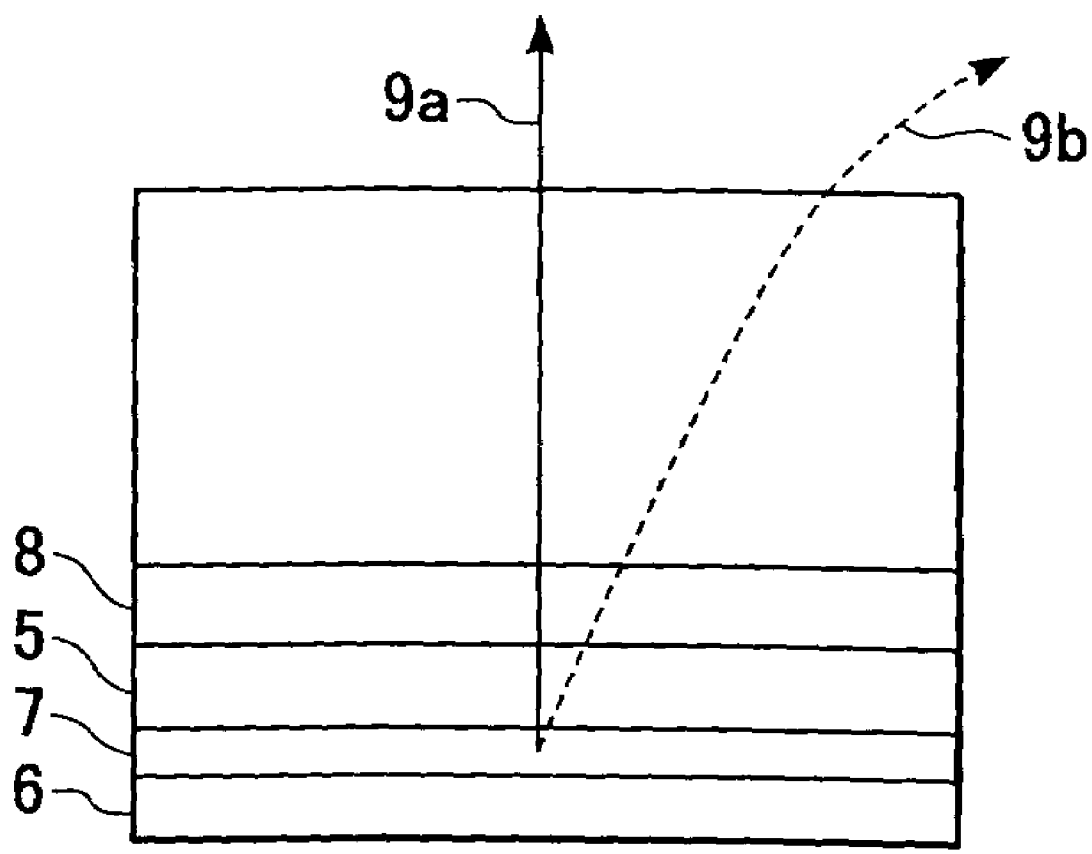
FIG. 6 is a sectional view showing another conventional organic EL device having a microresonator structure.

FIG. 4 is a schematic sectional view showing a full-color organic EL display according to a third embodiment of the present invention. The display of the third embodiment includes light-gathering structures different from those of the display of the second embodiment. However, the display of the third embodiment includes the same components, other than the light-gathering structures, as those of the display of the second embodiment.

The display of the third embodiment includes a multi-layer dielectric mirror layer 35 and a transparent microlens array layer 50 including microlens portions 41, periodically arranged at a pitch of 60 μm in a matrix, each having a convex face and a refractive index n of 1.61. The microlens array layer 50 is placed such that the convex faces face the multi-layer dielectric mirror layer 35. The microlens portions 41 have a radius of curvature of 30 μm and a lens diameter of 60 μm. The thickness, that is, the distance between the top (i.e., convex face in contact with the multi-layer dielectric mirror layer 35) of each microlens portion 41 and the upper face of the microlens array layer 50 (i.e., a face in contact with a light-shielding layer) is 70 μm.

A cavity portion 42 containing air is disposed between the multi-layer dielectric mirror layer 35 and the microlens array layer 50. The microlens portions 41 each include a microlens having a plano-convex shape, and the convex face of the microlens faces a portion through which light enters the microlens. The microlens has a focal length of about 79 μm and an F-number of 1.3. Light, emitted from each optical resonator structure (microcavity structure) and then gathered by each microlens portion 41, is brought to a focus located at a position that is about 79 μm from the top of each microlens. A light-shielding layer 40 having openings 39 is placed on the upper face of the microlens array layer 50.

According to the above configuration, the color purity is enhanced, and the reflection due to external light is suppressed, thereby achieving high quality display.

Furthermore, the portion through which light enters the microlenses has a refractive index smaller than that of the microlenses because the region contains air. Thus, incident light can be prevented from being totally reflected at the convex faces of the microlenses. Therefore, there is an advantage in that light emitted from an EL device can be efficiently transmitted to the outside even if the microlenses have a smaller radius of curvature, as compared with the configuration of the second embodiment.

Furthermore, since the convex faces face the portion through which light enters the microlenses, the spherical aberration of the microlenses is less than that of the microlenses of the second embodiment. This is advantageous from the viewpoint of optical performance. There is also an advantage in that the viewing angle is wider as compared with that of the second embodiment, although there is a disadvantage in that the luminous energy (luminance) observed in the front direction of a display is smaller than that of the second embodiment. Furthermore, the radius of curvature of the microlens, which must be set to a certain value in order to achieve a predetermined focal length, is larger; that is, the curvature is smoother, as compared with that of the second embodiment. This is also advantageous from the viewpoint of production and optical performance.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An organic electroluminescent display providing enhanced monochromatic and highly directed light comprising:
   an organic electroluminescent device, having a microcavity structure, for emitting light resonating in the microcavity structure;
   a light-gathering structure, overlying the organic electroluminescent device, for gathering the light emitted from the organic electroluminescent device; and
   a light-shielding layer comprising a light-absorbing member for preventing external light transmitted from the outside from being reflected, overlying the light-gathering structure, having an opening through which a portion of the light gathered by the light-gathering structure passes, wherein the light-gathering structure includes a lens having a focus, and the opening of the light-shielding layer is disposed in the vicinity of the focus of the lens, wherein the lens and the light-shielding layer having the opening cooperate to converge resonating light emitted from the microcavity structure at the opening of the light-shielding layer.

2. An organic electroluminescent display providing enhanced monochromatic and highly directed light comprising:
- an organic electroluminescent device array including a plurality of organic electroluminescent devices, each having a microcavity structure, for emitting light resonating in the microcavity structure;
- a light-gathering layer including light-gathering structures overlying the organic electroluminescent devices arranged so as to correspond to the organic electroluminescent devices, for gathering the light emitted from the organic electroluminescent devices; and
- a light-shielding layer comprising a light-absorbing member for preventing external light transmitted from the outside from being reflected, overlying the light-gathering structures, having openings through which a portion of the light emitted from the organic electroluminescent devices passes,
- wherein each light-gathering structure includes a lens having a focus and each opening of the light-shielding layer is arranged in the vicinity of a focus and
- wherein the organic electroluminescent devices are arranged in a plane and the openings are arranged so as to correspond to the light-gathering structures, wherein the lens and the light-shielding layer having the opening cooperate to converge resonating light emitted from the microcavity structure at the opening of the light-shielding layer.

3. The display according to claim 2, wherein the light-gathering layer includes first and second transparent members having different refractive indexes with spherical faces disposed therebetween.

4. The display according to claim 3, wherein the light-gathering layer includes a third transparent member having convex faces bulging toward the organic electroluminescent devices and a cavity portion disposed between the organic electroluminescent devices and the third transparent member.

5. The display according to claim 2, wherein the light-gathering structures of the light-gathering layer are arranged at a pitch smaller than or equal to a pitch at which the organic electroluminescent devices of the organic electroluminescent device array are arranged.

6. The display according to claim 2, wherein the openings are arranged such that light emitted in the direction perpendicular to a plane on which the organic electroluminescent devices are arranged passes through each opening.

7. The display according to claim 2, wherein the openings have a size determined based on a wavelength of light emitted from the organic electroluminescent devices.

8. The display according to claim 2, wherein the openings have a circular shape, a rectangular shape, or an elliptic shape.

9. An apparatus comprising:
- a controller for providing image information;
- an organic electroluminescent device, providing enhanced monochromatic and highly directed light and having a microcavity structure, for emitting light resonating in the microcavity structure, based on the image information provided from the controller;
- a light-gathering structure, overlying the organic electroluminescent device, for gathering the light emitted from the organic electroluminescent device; and
- a light-shielding layer comprising a light-absorbing member for preventing external light transmitted from the outside from being reflected, overlying the light-gathering structure, having an opening through which a portion of the light gathered by the light-gathering structure passes and
- wherein each light-gathering structure includes a lens having a focus and each opening of the light-shielding layer is arranged in the vicinity of a focus, wherein the lens and the light-shielding layer having the opening cooperate to converge resonating light emitted from the microcavity structure at the opening of the light-shielding layer.

10. An apparatus comprising:
- a controller for providing image information;
- an organic electroluminescent device array providing enhanced monochromatic and highly directed light including a plurality of organic electroluminescent devices, each having a microcavity structure, for emitting light resonating in the microcavity structure, based on the image information provided from the controller;
- a light-gathering layer including light-gathering structures overlying the organic electroluminescent devices arranged so as to correspond to the organic electroluminescent devices, for gathering the light emitted from the organic electroluminescent devices; and
- a light-shielding layer comprising a light-absorbing member for preventing external light transmitted from the outside from being reflected, overlying the light-gathering structure, having openings through which a portion of the light emitted from the organic electroluminescent devices passes, and
- wherein each light-gathering structure includes a lens having a focus and each opening of the light-shielding layer is arranged in the vicinity of a focus and
- wherein the organic electroluminescent devices are arranged on a plane and the openings are arranged so as to correspond to the light-gathering structures, wherein the lens and the light-shielding layer having the opening cooperate to converge resonating light emitted from the microcavity structure at the opening of the light-shielding layer.

* * * * *